(12) United States Patent
Nallamothu

(10) Patent No.: US 10,541,677 B2
(45) Date of Patent: Jan. 21, 2020

(54) LOW OUTPUT IMPEDANCE, HIGH SPEED AND HIGH VOLTAGE GENERATOR FOR USE IN DRIVING A CAPACITIVE LOAD

(71) Applicant: STMicroelectronics, Inc., Coppell, TX (US)

(72) Inventor: Pavan Nallamothu, Little Elm, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 16/156,246

(22) Filed: Oct. 10, 2018

(65) Prior Publication Data

US 2019/0044502 A1    Feb. 7, 2019

Related U.S. Application Data

(63) Continuation of application No. 15/351,542, filed on Nov. 15, 2016, now Pat. No. 10,128,821.

(51) Int. Cl.
| | |
|---|---|
| *H03K 3/00* | (2006.01) |
| *H03K 3/012* | (2006.01) |
| *G05F 1/575* | (2006.01) |
| *H03K 17/687* | (2006.01) |

(52) U.S. Cl.
CPC ............ *H03K 3/012* (2013.01); *G05F 1/575* (2013.01); *H03K 17/687* (2013.01)

(58) Field of Classification Search
CPC .... H03K 3/012; H03K 3/02337; H03K 5/082; H03K 5/02; H03K 17/687; H03K 19/00315; H03K 19/00361; G05F 1/465; G05F 1/575; G05F 3/242; G05F 3/262; G05F 3/265
See application file for complete search history.

(56) References Cited

U.S. PATENT DOCUMENTS

| | | | |
|---|---|---|---|
| 5,867,015 A | 2/1999 | Corsi et al. | |
| 6,587,000 B2 | 7/2003 | Oikawa | |
| 9,401,707 B1 * | 7/2016 | Song | H03K 17/165 |
| 10,128,821 B2 * | 11/2018 | Nallamothu | G05F 1/575 |
| 2017/0153657 A1 | 6/2017 | Yun | |
| 2017/0242448 A1 | 8/2017 | Wong | |

* cited by examiner

*Primary Examiner* — Long Nguyen
(74) *Attorney, Agent, or Firm* — Crowe & Dunlevy

(57) ABSTRACT

A voltage generator circuit uses a feedback loop to regulate an output voltage at an output node. A pair of opposite conductivity source-follower transistors are coupled to the output node. A first one of the source-follower transistors operates to provide a fast current transient for charging a capacitive load that is switchably connected to the output node. A second one of the source-follower transistor operate under feedback control to regulate the voltage level at the output node.

32 Claims, 1 Drawing Sheet

US 10,541,677 B2

LOW OUTPUT IMPEDANCE, HIGH SPEED AND HIGH VOLTAGE GENERATOR FOR USE IN DRIVING A CAPACITIVE LOAD

CROSS REFERENCE TO RELATED APPLICATION

This application is a continuation of U.S. application patent. Ser. No. 15/351,542 filed Nov. 15, 2016, the disclosure of which is incorporated by reference.

TECHNICAL FIELD

The present invention relates to voltage generator circuits and, in particular, to a voltage generator circuit for use in driving a capacitive load with low output impedance, high speed and high voltage.

BACKGROUND

There are a number of system applications where a capacitive load must be driven by a periodic signal with a high voltage level and where that high voltage level must settle to a regulated voltage level very quickly. In other words, the driver must operate to drive the capacitive load from a low voltage to the regulated high voltage with a very fast slew rate. An example of such a capacitive load is the rotor of a gyroscope. High speed gyro rotor excitation requires a regulated drive voltage that is fast enough to charge the capacitive terminals (~10 pF) to the desired high voltage within less than one percent of the excitation frequency of the periodic drive signal (~10 ns) in order to minimize error contribution due to rotor excitation. However, prior art voltage generator circuits used to drive capacitive loads show poor operating performance.

SUMMARY OF THE INVENTION

It is to be understood that both the foregoing general description and the following detailed description are exemplary and explanatory and are intended to provide further explanation of the invention as claimed.

In an embodiment, a voltage generator circuit comprises: a differential amplifier having a first input receiving a reference voltage and a second input receiving a feedback voltage; a first transistor of a first conductivity type having a gate terminal coupled to an output of the differential amplifier and having a drain terminal; a second transistor of a second conductivity type configured as a source-follower with a gate terminal coupled to the drain terminal of the first transistor and a source terminal coupled to a voltage output node; a third transistor of the first conductivity type configured as a source-follower with a gate terminal coupled to bias current node and a source terminal coupled to said voltage output node; and a bias circuit configured to generate a bias current for application to said bias current node.

In an embodiment, a voltage generator circuit comprises: a capacitive output node; a first source-follower transistor of a first conductivity type configured to source current to the capacitive output node; a second source-follower transistor of a second conductivity type configured to sink current from the capacitive output node; a differential amplifier having a first input receiving a reference voltage and a second input receiving a feedback voltage derived from a voltage at the capacitive output node; and wherein said second source-follower transistor is controlled in response to an output of the differential amplifier.

In an embodiment, a voltage generator circuit comprises: a first current source transistor configured to generate a variable current; and an output circuit having an input circuit leg configured to receive the variable current and an output circuit leg configured to generate an output voltage. The input circuit leg comprises: a first diode-connected transistor of a first conductivity type; and a second diode-connected transistor of a second conductivity type coupled in series with the first diode-connected transistor. The output circuit leg comprises: a first source-follower transistor of the first conductivity type having a gate terminal connected to a gate terminal of the first diode-connected transistor; a second source-follower transistor of the second conductivity type coupled in series with the first source-follower transistor and having a gate terminal connected to a gate terminal of the second diode-connected transistor; and an output node for the output voltage at connected source terminals of the first and second source-follower transistors.

In an embodiment, a voltage generating circuit includes an input circuit leg and an output circuit leg. The input circuit leg comprises: a first diode-connected transistor of a first conductivity type; and a second diode-connected transistor of a second conductivity type coupled in series with the first diode-connected transistor. The output circuit leg comprises: a first source-follower transistor of the first conductivity type having a gate terminal connected to a gate terminal of the first diode-connected transistor; a second source-follower transistor of the second conductivity type coupled in series with the first source-follower transistor and having a gate terminal connected to a gate terminal of the second diode-connected transistor; and an output node at connected source terminals of the first and second source-follower transistors.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
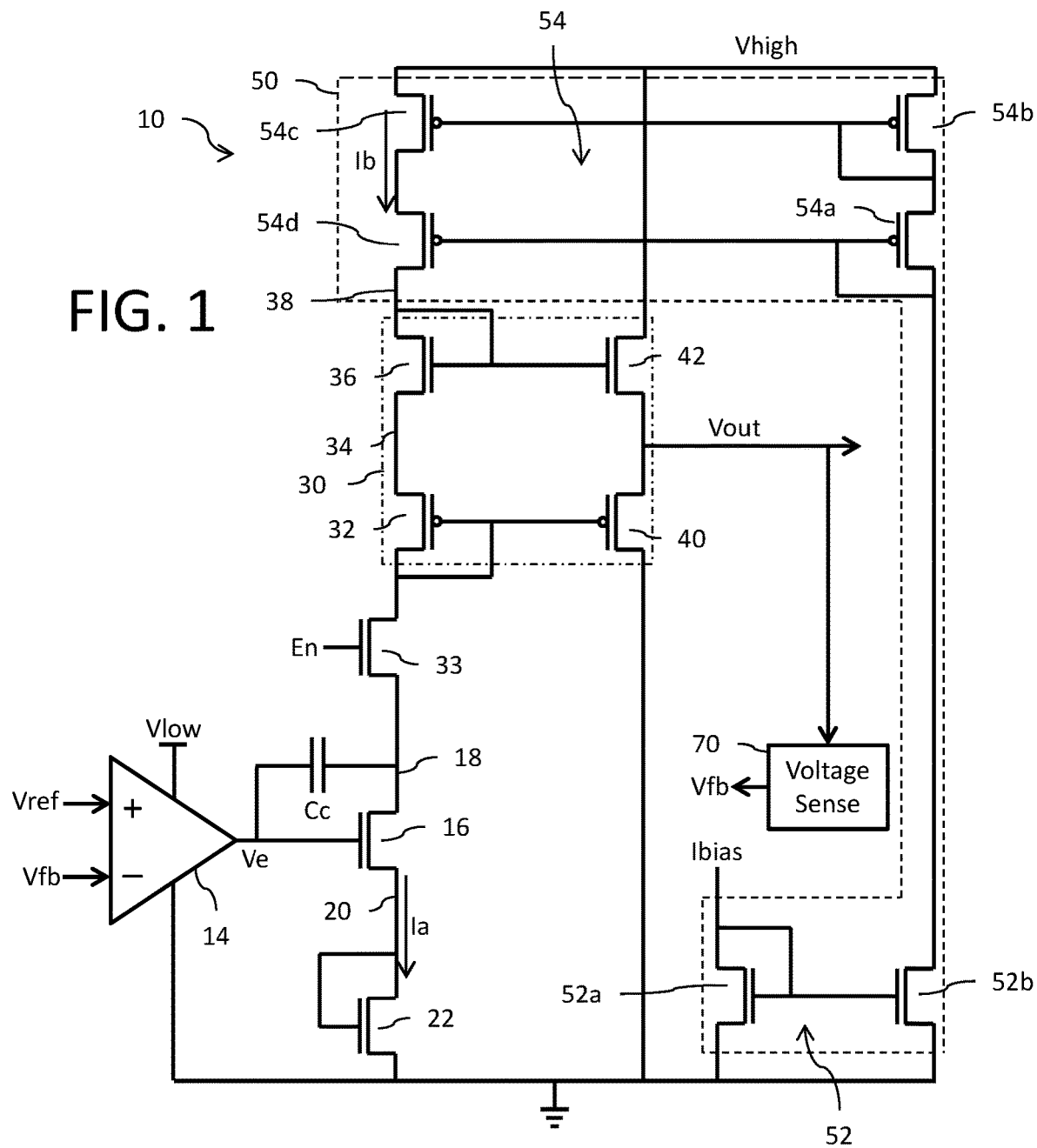
FIG. 1 is a circuit diagram of a voltage generator circuit.

FIG. 1 shows a circuit diagram of a voltage generator circuit 10 for generating an output voltage Vout. The circuit 10 includes a differential amplifier circuit 14 having a non-inverting (+) input configured to receive a reference voltage Vref and an inverting (−) input configured to receive a feedback voltage Vfb. The differential amplifier circuit 14 is powered from a low supply voltage Vlow. The reference voltage Vref is preferably generated using a bandgap reference voltage generator. The output signal Ve of the differential amplifier circuit 14 is a voltage having a magnitude equal to the amplified difference between Vref and Vfb. The output signal Ve is applied to the control terminal (gate) of an n-channel metal oxide semiconductor field effect transistor (MOSFET) 16 to generate a current Ia that flows through the source-drain path of transistor 16. A first conduction terminal (drain) of the transistor 16 is coupled to node 18. A second conduction terminal (source) of the transistor 16 is coupled to node 20. A compensation capacitor Cc is coupled between node 18 and the output of the amplifier 14. A diode-connected transistor 22 is coupled between node 20 and a ground (Gnd) node. The diode-connected transistor 22 is an n-channel MOSFET with its source coupled to ground and its drain coupled to node 20 and to the gate of transistor 22. Thus, the source-drain path of transistor 22 is coupled in series with the source-drain path of transistor 16 at node 20. This diode-connected transistor 22 is provided to set the minimum bias voltage at the gate of transistor 16 to 2*Vt.

The voltage generator circuit 10 further includes a high voltage, low impedance output circuit 30 coupled between node 18 and the output voltage Vout node. The circuit 30 includes a p-channel MOSFET transistor 32 having a drain coupled to node 18 through an n-channel MOSFET transistor switch 33 and a source coupled to intermediate node 34. The gate of transistor 32 is coupled to the drain of transistor 32 at node 18, and thus transistor 32 is a diode-connected transistor. The circuit 30 further includes an n-channel MOSFET transistor 36 having a drain coupled to node 38 and a source coupled to intermediate node 34. The gate of transistor 36 is coupled to the drain of transistor 36 at node 38, and thus transistor 36 is a diode-connected transistor. The source-drain paths of transistors 32 and 36 are accordingly coupled in series at intermediate node 34, and further coupled in series with the source-drain paths of transistors 16 and 22 to form an input leg of the circuit 30.

The on/off state of the transistor switch 33 is controlled by an enable signal (EN). The transistor switch 33 separates the high voltage devices of the circuit 30 from the low voltage devices (transistors 16 and 22) and thus protects the low voltage devices from an overvoltage condition.

The circuit 30 further includes a p-channel MOSFET transistor 40 having a drain coupled to the ground node and a source coupled to the output voltage Vout node. The gate of transistor 40 is coupled to the gate of transistor 32. The transistor 40 is configured as a source-follower. The circuit 30 further includes an n-channel MOSFET transistor 42 having a drain coupled to a high voltage power supply voltage (Vhigh) node and a source coupled to the output voltage Vout node. The gate of transistor 44 is coupled to the gate of transistor 36. The transistor 42 is configured as a source-follower. The source-drain paths of transistors 40 and 42 are thus coupled in series at the output voltage node and form an output leg of the circuit 30.

The high voltage power supply voltage (Vhigh) node is greater than the low supply voltage Vlow (for example, Vhigh may be 20V and Vlow may be 3V). In an embodiment, the high voltage power supply voltage Vhigh is generated using a charge pump circuit (not shown) from the low supply voltage Vlow.

A bias circuit 50 operates to source a bias current Ib to bias the high voltage, low impedance output circuit 30. The bias circuit 50 receives a reference bias current Ibias that is mirrored by an n-channel MOSFET transistor current mirror 52 (with transistors 52a, 52b) and p-channel cascode MOSFET current mirror 54 (with transistors 54a, 54b, 54c, 54d) to output the bias current Ib. The bias circuit 50 is also coupled to the high voltage power supply voltage (Vhigh) node. In DC operation, Ia=Ib.

The transistors 32 and 40 form an nMOS current mirroring circuit. Likewise, the transistors 36 and 42 form a pMOS current mirroring circuit. The bias voltages at the connected gate terminals of nMOS and pMOS current mirroring circuits are set by the voltage at the output voltage node (Vout) and the currents Ia and Ib. The transistors 40 and 42 provide a low impedance output and function, responsive to the current Ia and Ib, respectively, to sink current from and source current to the output voltage node. As a result, the fast current transients needed to quickly charge a capacitive load are available at the output voltage node.

A voltage sensing circuit 70 is coupled to the sense the output voltage Vout at the output voltage Vout node and operates to generate therefrom the feedback voltage Vfb. The voltage sensing circuit 70 may, for example, comprise a resistive voltage divider circuit. In one implementation, the voltage division ratio has a fixed value. In another implementation, the voltage division ratio is variable. The voltage division ratio sets the value of the regulated voltage at the output voltage Vout node. In an embodiment, the output voltage Vout may have a regulated value of approximately, 4V. Adjustment of the voltage division ratio can be used to select other voltage levels of, for example, 10V or 15V (assuming a sufficient voltage level for the high voltage power supply voltage Vhigh).

Figure 2:
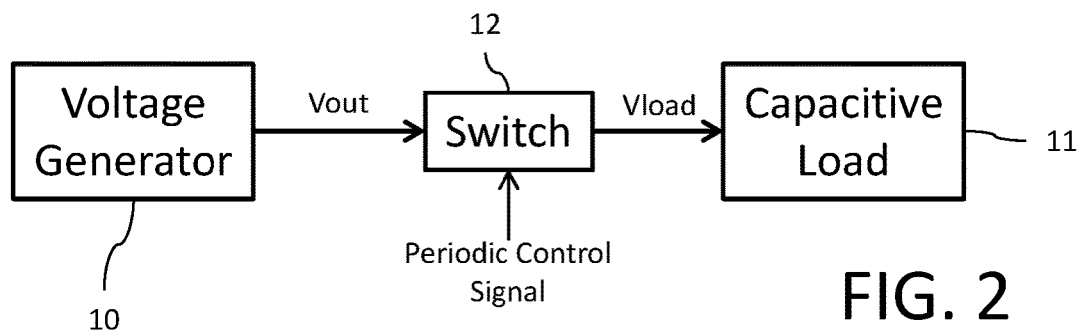
FIG. 2 is a block diagram for a circuit to drive a capacitive load.

Reference is now made to FIG. 2 showing a block diagram for a circuit to drive a capacitive load 11. The voltage generator circuit 10 outputs the output voltage Vout and is connected to a first terminal of a switching circuit 12. A second terminal of the switching circuit 12 is coupled to the capacitive load 11. The open/closed state of the switching circuit 12 is controlled by a periodic control signal. When the periodic control signal is asserted, the switching circuit 12 is closed and the capacitive load is charged by the output voltage Vout from the voltage generator circuit 10. The output voltage Vout node of the voltage generator circuit 10 has low output impedance due to the source follower configuration provided by transistors 40 and 42. Because of the low output impedance, fast current transients are generated to quickly charge the capacitive load 11. The voltage at the load Vload will accordingly rise quickly. The negative feedback through the voltage sense circuit 70 and amplifier 14 regulates the output voltage Vout and thus also regulates the load voltage Vload.

In operation, consider the initial condition where the capacitive load 11 is connected by switch 12 to the output voltage node and the circuit 10 needs to charge the capacitor to a desired output voltage. The voltage at the output voltage node starts at 0V. The transistor 42 has a large Vgs and accordingly sources a high current to quickly charge the capacitive load. The voltage at the output voltage node rises in response to the current sourced by transistor 42. As the voltage on the capacitor rises toward the desired output voltage, the Vgs of transistor 42 begins to collapse. The fast transient response of the circuit 30 reduces. Once sufficient voltage is present at the output voltage node, the negative feedback through amplifier 14 and transistor 40 stabilizes the output voltage at the desired output voltage value. The voltage division ratio set by the voltage sense circuit 70 sets the desired output voltage value.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A voltage generator circuit, comprising:
   a first current source transistor configured to generate a variable current;
   an output circuit having an input circuit leg configured to receive the variable current and an output circuit leg configured to generate an output voltage;
   wherein the input circuit leg comprises:

a first diode-connected transistor of a first conductivity type; and a second diode-connected transistor of a second conductivity type coupled in series with the first diode-connected transistor;

wherein the output circuit leg comprises:

a first source-follower transistor of the first conductivity type having a gate terminal connected to a gate terminal of the first diode-connected transistor;

a second source-follower transistor of the second conductivity type coupled in series with the first source-follower transistor and having a gate terminal connected to a gate terminal of the second diode-connected transistor; and an output node for the output voltage at connected source terminals of the first and second source-follower transistors; and a differential amplifier having a first input configured to receive a reference voltage and a second input configured to receive a feedback voltage derived from the output voltage, wherein an output of the differential amplifier is connected to a gate terminal of the first current source transistor.

2. The voltage generator circuit of claim 1, further comprising a second current source transistor configured to generate a bias current that is applied to the input circuit leg.

3. The voltage generator circuit of claim 2, wherein the bias current is applied to connected drain and gate terminals of the second diode-connected transistor.

4. The voltage generator circuit of claim 1, further comprising a voltage sense circuit configured to generate the feedback voltage from the output voltage.

5. The voltage generator circuit of claim 1, further comprising a compensation capacitor connected between the output of the differential amplifier and a drain terminal of the first current source transistor.

6. The voltage generator circuit of claim 1, wherein the variable current is applied to connected drain and gate terminals of the first diode-connected transistor.

7. The voltage generator circuit of claim 1, wherein the first and second diode-connected transistors are coupled in series at connected source terminals of the first and second diode-connected transistors.

8. The voltage generator circuit of claim 1, further comprising:

a capacitive load; and a switching circuit configured to selectively connect the output voltage to the capacitive load.

9. The voltage generator circuit of claim 8, wherein selective connection by the switching circuit is driven in response to a periodic control signal.

10. A voltage generating circuit, comprising:

an input circuit leg and an output circuit leg, wherein:

the input circuit leg comprises:

a first diode-connected transistor of a first conductivity type; and a second diode-connected transistor of a second conductivity type coupled in series with the first diode-connected transistor;

the output circuit leg comprises:

a first source-follower transistor of the first conductivity type having a gate terminal connected to a gate terminal of the first diode-connected transistor;

a second source-follower transistor of the second conductivity type coupled in series with the first source-follower transistor and having a gate terminal connected to a gate terminal of the second diode-connected transistor; and an output node at connected source terminals of the first and second source-follower transistors; and a first current source configured to generate a variable current applied to the input circuit leg;

wherein the variable current is generated in response to a difference between an output voltage generated at the output node and a reference voltage.

11. The voltage generating circuit of claim 10, wherein the first current source is configured to apply the variable current to the input circuit leg at connected drain and gate terminals of first diode-connected transistor; and further including a second current source configured to apply a second current to the input circuit leg at connected drain and gate terminals of second diode-connected transistor.

12. The voltage generating circuit of claim 11, wherein the second current is a fixed current.

13. The voltage generating circuit of claim 12, further comprising a differential amplifier having a first input configured to receive the reference voltage and a second input configured to receive a feedback voltage derived from the output voltage, wherein an output of the differential amplifier is configured to control generation of the variable current.

14. The voltage generating circuit of claim 10, wherein the first and second diode-connected transistors are coupled in series at connected source terminals of the first and second diode-connected transistors.

15. The voltage generating circuit of claim 10, further comprising:

a capacitive load; and a switching circuit configured to selectively connect the output voltage to the capacitive load.

16. The voltage generating circuit of claim 15, wherein selective connection by the switching circuit is driven in response to a periodic control signal.

17. A voltage generator circuit, comprising:

a first current source transistor configured to generate a variable current;

an output circuit having an input circuit leg configured to receive the variable current and an output circuit leg configured to generate an output voltage;

wherein the input circuit leg comprises:

a first diode-connected transistor of a first conductivity type; and a second diode-connected transistor of a second conductivity type coupled in series with the first diode-connected transistor;

wherein the output circuit leg comprises:

a first source-follower transistor of the first conductivity type having a gate terminal connected to a gate terminal of the first diode-connected transistor;

a second source-follower transistor of the second conductivity type coupled in series with the first source-follower transistor and having a gate terminal connected to a gate terminal of the second diode-connected transistor; and an output node for the output voltage at connected source terminals of the first and second source-follower transistors;

a capacitive load; and a switching circuit configured to selectively connect the output voltage to the capacitive load.

18. The voltage generator circuit of claim 17, wherein selective connection by the switching circuit is driven in response to a periodic control signal.

19. The voltage generator circuit of claim 17, further comprising a second current source transistor configured to generate a bias current that is applied to the input circuit leg.

20. The voltage generator circuit of claim 19, wherein the bias current is applied to connected drain and gate terminals of the second diode-connected transistor.

21. The voltage generator circuit of claim 17, further comprising a differential amplifier having a first input configured to receive a reference voltage and a second input configured to receive a feedback voltage derived from the output voltage, wherein an output of the differential amplifier is connected to a gate terminal of the first current source transistor.

22. The voltage generator circuit of claim 21, further comprising a voltage sense circuit configured to generate the feedback voltage from the output voltage.

23. The voltage generator circuit of claim 21, further comprising a compensation capacitor connected between the output of the differential amplifier and a drain terminal of the first current source transistor.

24. The voltage generator circuit of claim 17, wherein the variable current is applied to connected drain and gate terminals of the first diode-connected transistor.

25. The voltage generator circuit of claim 17, wherein the first and second diode-connected transistors are coupled in series at connected source terminals of the first and second diode-connected transistors.

26. A voltage generating circuit including an input circuit leg and an output circuit leg, wherein:
   the input circuit leg comprises:
      a first diode-connected transistor of a first conductivity type; and
      a second diode-connected transistor of a second conductivity type coupled in series with the first diode-connected transistor;
   the output circuit leg comprises:
      a first source-follower transistor of the first conductivity type having a gate terminal connected to a gate terminal of the first diode-connected transistor;
      a second source-follower transistor of the second conductivity type coupled in series with the first source-follower transistor and having a gate terminal connected to a gate terminal of the second diode-connected transistor; and
      an output node at connected source terminals of the first and second source-follower transistors;
   a capacitive load; and
   a switching circuit configured to selectively connect the output voltage to the capacitive load.

27. The voltage generating circuit of claim 26, wherein selective connection by the switching circuit is driven in response to a periodic control signal.

28. The voltage generating circuit of claim 26, further comprising:
   a first current source configured to apply a first current to the input circuit leg at connected drain and gate terminals of first diode-connected transistor; and
   a second current source configured to apply a second current to the input circuit leg at connected drain and gate terminals of second diode-connected transistor.

29. The voltage generating circuit of claim 28, wherein one of the first and second currents is a fixed current and another of the first and second currents is a variable current.

30. The voltage generating circuit of claim 29, wherein the variable current is generated in response to a difference between an output voltage generated at the connected source terminals of the first and second source-follower transistors and a reference voltage.

31. The voltage generating circuit of claim 29, further comprising a differential amplifier having a first input configured to receive the reference voltage and a second input configured to receive a feedback voltage derived from the output voltage, wherein an output of the differential amplifier is configured to control generation of the variable current.

32. The voltage generating circuit of claim 26, wherein the first and second diode-connected transistors are coupled in series at connected source terminals of the first and second diode-connected transistors.

* * * * *